United States Patent [19]

Olschewski et al.

[11] 4,112,308
[45] Sep. 5, 1978

[54] OPTICAL COUPLING SYSTEM

[75] Inventors: Wilfred W. Olschewski; Robert M. Stitt, both of Tucson, Ariz.

[73] Assignee: Burr-Brown Research Corporation, Tucson, Ariz.

[21] Appl. No.: 830,586

[22] Filed: Sep. 6, 1977

Related U.S. Application Data

[63] Continuation-in-part of Ser. No. 671,324, Mar. 29, 1976, abandoned.

[51] Int. Cl.² .............................................. G02B 27/00
[52] U.S. Cl. ........................................ 250/551; 357/19
[58] Field of Search ............................ 250/551; 357/19

[56] References Cited
U.S. PATENT DOCUMENTS 3,818,451  6/1974  Coleman ............................ 250/551
3,976,877  8/1976  Thillays ............................. 250/551
4,005,312  1/1977  Lemelson .......................... 357/19
4,054,801  10/1977  Breval et al. ..................... 250/551

Primary Examiner—David C. Nelms
Attorney, Agent, or Firm—Cahill, Sutton & Thomas

[57] ABSTRACT

An optical coupling system is described incorporating a light emitting semiconductive device mounted on a substrate having an electrically conductive strip leading to and from the device. A plurality of photo detector, semiconductive devices are mounted on the substrate adjacent to and co-planar with the light emitting device. A housing is mounted over the semiconductive devices and is filled with a clear light transmitting resin; the interior surfaces of the housing are light reflecting so that light emitted by the light emitting semiconductive device is reflected and diffused therefrom impinging upon each of the photo detector, semiconductive devices.

7 Claims, 3 Drawing Figures

OPTICAL COUPLING SYSTEM

This is a continuation-in-part of an application entitled "OPTICAL COUPLING SYSTEM", Ser. No. 671,324, filed Mar. 29, 1976 now abandoned.

The present invention relates to the utilization of light paths in electrical circuitry for isolating portions of an electrical circuit from other portions of the circuit; more specifically, the present invention relates to an optical coupling system for providing electrical isolation in an electrical circuit.

The utilization of optical coupling schemes in electrical circuitry is well known. The desirability of interconnecting electrical circuits without permitting direct electrical connection is an established requirement in many circuit applications. An optical path effectively isolates each circuit from the other except for the signal represented by the transmitted light. Optical coupling in the prior art has progressed to the use of semiconductive light emitters and photo-responsive devices for receiving the light and generating an electrical signal in response thereto.

Prior art optical coupling techniques have included the positioning of a light transmitting semiconductor device and light receiving device in face-to-face relationship so that light is transmitted directly to the receiving surface. Other prior art techniques have included the use of a reflective housing for directing light from an enclosed light emitter to a photo-responsive device. However, the manufacturing procedures and the resulting hybrid structures caused by the implementation of the prior art techniques, are complex and do not lend themselves to compact, reliable and inexpensively produced hybrid structures. For example, it is important that the optical coupling device be as compact as possible without requiring conductive paths extending through the supporting substrate. Further, the resulting structure should not require undesirable procedural changes in the processing of the hybrid circuit.

Prior art that is believed relevant:

U.S. Pat. No. 3,636,358: This patent discloses an optically coupled circuit device having opposed circuit planes. Light is transmitted through a glass structure and impinges upon a photo diode positioned opposite to the light source.

U.S. Pat. No. 3,649,837: This patent discloses an optical coupling arrangement wherein light is directed through a supporting substrate and is reflected from an opposite surface of the substrate onto a target contact.

U.S. Pat. No. 3,660,669: An optical coupler is disclosed by this patent which incorporates a light emitter and light sensor positioned in opposed face-to-face arrangement.

U.S. Pat. No. 3,812,369: This patent describes a form of optical switching through the use of diodes arranged in an array such that the respective devices act as sequential switches.

U.S. Pat. No. 3,818,451: This patent describes the use of a logic array having an arrangement of light emitters and light receivers positioned within a housing. Electrical connection to the emitters and receivers are made through a supporting header by electrical conductors insulated from the header and passing through the header to the emitters and receivers.

U.S. Pat. No. 3,819,938: Electro-optical transducer is described by this patent for detecting the presence of an object by the interception and reflection of transmitted light. The reflected light is directed onto a photo-responsive device.

U.S. Pat. No. 3,893,158: This patent describes a structure for mounting opposing semiconductor chips having a layer of transparent material mounted therebetween. The respective chips are in face-to-face relationship.

U.S. Pat. No. 3,976,877: A light transmitting and receiving device is described wherein the transmitting and receiving semiconductor device are placed in opposing relation with respect to each other. A light conducting substance is positioned between the devices and is formed into co-axial paraboloids to increase the efficiency of the light transmission.

U.S. Pat. No. 3,978,343: A circuit is described incorporating optical coupling wherein a light emitting diode and a photo diode are positioned in face-to-face relationship with respect to each other.

It is therefore an object of the present invention to provide an optical coupling system that may conveniently be used in conjunction with hybrid integrated circuits.

It is another object of the present invention to provide an optical coupling system that efficiently utilizes the light emitted by a light emitting semiconductive device, and which system may readily be implemented in hybrid production.

It is still another object of the present invention to provide an optical coupling system for use with a hybrid integrated circuit wherein a single photo source may provide radiation to a plurality of photo detector devices.

It is yet another object of the present invention to provide an optical coupling system that may be utilized with hybrid integrated circuits wherein photo emitting semiconductive devices or chips and photo detector semiconductive devices or chips are mounted in substantially co-planar relationship to each other.

It is a further object of the present invention to provide an optical coupling system for use in hybrid integrated circuits wherein the light emitted by the radiation source is diffused to permit its use upon a plurality of photo detectors.

Briefly, and in accordance with one embodiment of the present invention, a substrate is provided with a plurality of electrically conductive strips. Each of the strips is interrupted; the resulting opposing ends of each conductive strip form a gap. A pad may be formed at one end of each strip to receive a semiconductive chip. A light emitting diode chip is mounted on one such pad with one surface of the diode chip in intimate contact with the pad. The opposite surface of the diode chip is provided with a conductive wire that bridges the gap to the other end of the corresponding conductive strip to thus provide a continuous electrical path to the diode.

Adjacent conductive strips also incorporate pads upon which are mounted photo detectors responsive to the receipt of light impinging thereon. A housing is mounted over all semiconductive devices and is filled with a light conducting resin. The housing includes a reflective inner surface; light generated by the light emitting diode is thus reflected and diffused throughout the housing and impinges upon all of the photo detector devices.

The present invention may more readily be described by reference to the following drawings in which.

Figure 1:
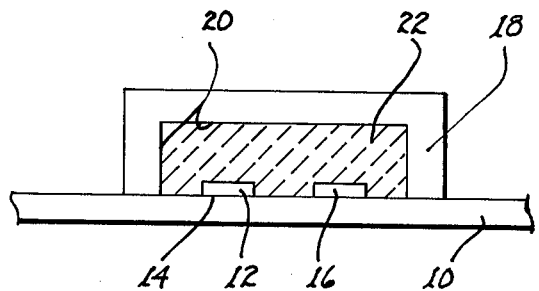
FIG. 1 is a cross-sectional view of an optical coupling system showing one embodiment of the present invention.

Referring now to FIG. 1, a substrate 10 is shown which may be a conventional substrate that has been processed in accordance with well known techniques to provide desired electrical components and conductive paths. The substrate 10 is electrically insulating and optically opaque. A light emitting semiconductive device 12, which may be a well known light source such as currently available light emitting diodes, is mounted on the substrate 10. One surface 14 of the device 12 is in contact with an electrically conductive strip (not shown in FIG. 1) provided on the substrate 10. A photo detector semiconductive chip 16 is similarly mounted on the substrate 10 and is positioned substantially co-planar with the device 12. A housing 18 having an open bottom is placed over the semiconductive devices 12 and 16 in contact with the substrate 10. The housing 18 includes optically reflective interior surfaces 20 and is constructed of optically opaque material. The interior 22 of the housing may contain a clear resin or other optically transparent material having an index of refraction that approximately matches the index of refraction of the emitter and detectors to thereby minimize interface reflections and maximize light transfer efficiency.

Light emitted by the semiconductive device 12 is thus transmitted throughout the interior of the housing 18 and is reflected and diffused while ultimately impinging upon the detector 16. Many materials may be utilized in the housing other than clear resin since a variety of organic and inorganic materials are sufficiently optically transparent and provide a suitable index of refraction. Further, the interior of the housing may contain merely air or possibly may even be evacuated. The material 22 should be chosen to have a high dielectric strength and low optical absorption in the frequency region of the optical signal being used. As used herein, the terms "light" and "optical" do not necessarily mean "visible" to the human eye. It has been found that most semiconductive devices such as light emitting diodes and photo diodes or photo transistors operate at peak efficiency at a wave length of approximately 900 nanometers; that is, peak efficiency is in the infrared region.

The housing 18 may be formed of a variety of materials such as white epoxy or a white ceramic material. It was found advantageous to provide a ceramic box-like structure around the semiconductive devices and then to fill the box-like structure with a clear resin. After curing the resin, a ceramic top was placed on the box-like structure to complete the housing.

Figure 2:
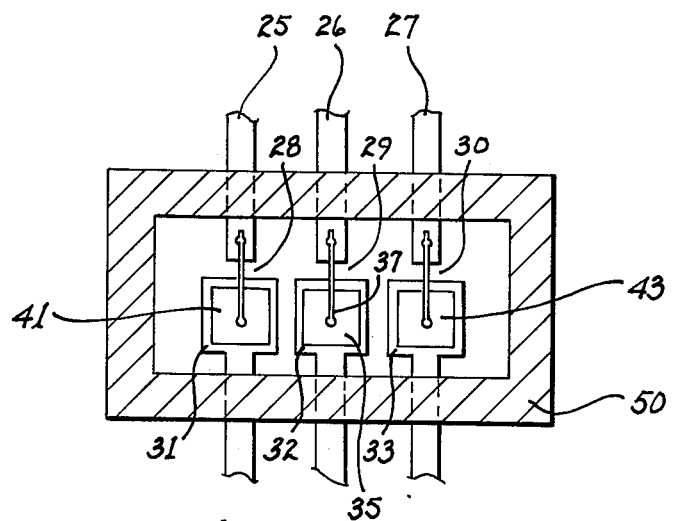
FIG. 2 is a top view of another embodiment of the present invention.
Figure 3:
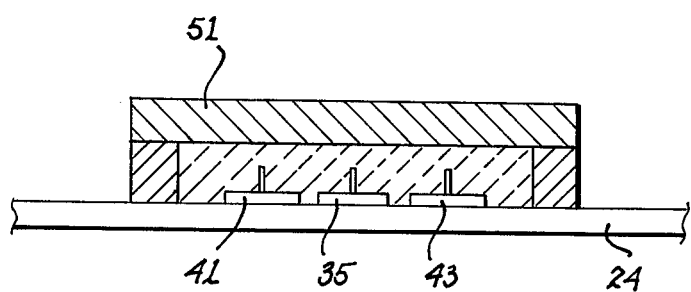
FIG. 3 is a cross-sectional view of the apparatus of FIG. 2.

Referring now to FIGS. 2 and 3, the present invention is shown in somewhat greater detail and in the form of another embodiment. A substrate 24 is provided with substantially co-planar electrical conductors or conductive strips 25, 26 and 27 in a well known manner. Each of the conductors is interrupted to provide a gap such as shown at 28, 29 and 30, respectively. One opposing end of each conductive strip adjacent the corresponding gap is enlarged to form a pad such as that shown at 31, 32 and 33, respectively. A light emitting semiconductive device such as a light emitting diode chip 35 is mounted on the pad 32. Electrical connection to the diode 35 is completed using well known wire bonding techniques, thus resulting in a wire 37 connected to the top of the diode and to the corresponding conductive strip 26 on the opposite side of the gap 29. In a similar manner, photo detector semiconductive devices such as photo diode chips 41 and 43 are mounted on the pads 31 and 33, respectively.

The semiconductive devices, all in semiconductive chip form, are therefore mounted in substantially co-planar relationship with respect to each other. Each chip is supported by a substrate 24 and is mounted on the substrate in contact with a conductive strip. While the semiconductive devices or chips 35, 41 and 43 may have different thicknesses, the surfaces of each chip facing the substrate 24 are nevertheless co-planar and the chips may therefore be considered to be substantially co-planar. A housing 50 having an open bottom is placed over the semiconductive devices 35, 41 and 43 and is secured to the substrate 24 in any convenient manner such as by cementitious bonding. In the embodiment chosen for illustration, the housing 50 incorporates a separate top 51 which is left off when the housing is bonded to the substrate 24. A clear resin is then poured into the open housing and cured and the top 51 then replaced and bonded in position. The resulting structure thus incorporates a housing mounted on a supporting substrate having co-planar conductive strips extending from beneath the housing. The co-planar semiconductive devices are positioned within the housing to provide optical coupling. The entire optical coupling system is compatible with hybrid manufacturing techniques and provides a means for including an electrical isolation function in a hybrid circuit.

In operation, the light emitted by the semiconductive device 35 is reflected and diffused throughout the interior of the housing and impinges upon both the photo detector semiconductive devices 41 and 43. Using the system of the present invention, greater light efficiency is obtained since all of the light emitted from the light emitting diode 35 is utilized in the housing; current light emitting diodes emit approximately 50 percent of their light from the sides or exposed junction edges thereof. Accordingly, even though the light is emitted from the edges of the diode, it is reflected and diffused throughout the housing interior to be utilized by the photo detectors.

In some instances it may be desirable to form the housing of resin having an appropriate index of reflection; in these circumstances, the resin may simply be deposited over the semiconductive devices and cured. A coating may then be applied to the cured resin to provide an interior reflective surface.

What is claimed is:

1. An optical coupling system for use in an electrical circuit for electrically isolating one portion of said electrical circuit from another portion of said electrical circuit, said optical coupling system comprising in combination:
    (a) an electrically insulating and optically opaque substrate;
    (b) a plurality of co-planar electrically conductive strips positioned on said substrate, including first and second conductive strips separated by a first non-conductive gap, and third and fourth conductive strips separated by a second non-conductive gap;
    (c) a light emitting semiconductive device mounted on the upper surface of said first conductive strip adjacent the first gap;

(d) first means for electrically connecting the top electrode of said light emitting semiconductive device to said second conductive strip on the other side of the first gap to provide an electrically continuous path to said light emitting semiconductive device;

(e) a first photo detector semiconductive device mounted on the upper surface of said third conductive strip adjacent the second gap;

(f) second means for electrically connecting said first photo detector semiconductive device to said fourth conductive strip adjacent the second gap to provide an electrically continuous path to said second photo detector semiconductive device;

(g) said light emitting semiconductive device and said first photo detector semiconductive device being mounted in substantially co-planar relationship with respect to each other; and (h) an open bottom housing mounted on said substrate over said semiconductive devices to enclose said semiconductive devices, said open bottom housing having light reflecting interior surfaces, said first, second, third and fourth conductive strips extending outwardly from the bottom of said open bottom housing;

whereby, light emitted by said light emitting semiconductive device is reflected throughout said open-bottom housing and impinges upon said photo detector semiconductive device.

2. The optical coupling system of claim 1 wherein said plurality of co-planar electrically conductive strips includes fifth and sixth conductive strips separated by a third non-conductive gap, and further including a second photo detector semiconductive device mounted on the upper surface of said fifth conductive strip adjacent the third gap, and third means electrically connecting said second photo detector semiconductive device to said sixth conductive strip adjacent the other side of the third gap to provide an electrically continuous path to said second photo detector semiconductive device.

3. The optical coupling system of claim 2 wherein each of said first, third, and fifth conductive strips includes a pad, whereon said light emitting semiconductive device and said first and second photo detector semiconductive devices are mounted, respectively.

4. The optical coupling system of claim 1 wherein said open bottomed housing contains an optically transparent resin contacting and encasing said semiconductive devices.

5. The optical coupling system of claim 4 wherein said open bottom housing includes a side wall section having an open top region and a top member attached to said side wall section to seal said open top region.

6. The optical coupling system of claim 1 wherein said first means includes a first wire bonding conductor wire bonded to said light emitting semiconductive device and to said second conductive strip adjacent the first gap, and said second means includes a second wire bonding conductor wire bonded to said first photo detector semiconductive device and to said fourth conductive strip adjacent the second gap.

7. In a hybrid integrated circuit structure, an optical coupling system for use in an electrical circuit for electrically isolating one portion of said electrical circuit from another portion of said electrical circuit, said optical coupling system comprising in combination:

(a) an electrically insulating and optically opaque substrate of said hybrid integrated circuit structure;

(b) a plurality of co-planar electrically conductive strips positioned on said substrate, including first and second conductive strips separated by a first non-conductive gap, and third and fourth conductive strips separated by a second non-conductive gap;

(c) a light emitting semiconductive device mounted on the upper surface of said first conductive strip adjacent the first gap;

(d) first means for electrically connecting the top electrode of said light emitting semiconductive device to said second conductive strip on the other side of the first gap to provide an electrically continuous path to said light emitting semiconductive device;

(e) a first photo detector semiconductive device mounted on the upper surface of said third conductive strip adjacent the second gap;

(f) second means for electrically connecting said first photo detector semiconductive device to said fourth conductive strip adjacent the second gap to provide an electrically continuous path to said second photo detector semiconductive device;

(g) said light emitting semiconductive device and said first photo detector semiconductive device being mounted in substantially co-planar relationship with respect to each other; and (h) an open bottom housing mounted on said substrate over said semiconductive devices to enclose said semiconductive devices, said open bottom housing having light reflecting interior surfaces, said first, second, third and fourth conductive strips extending outwardly from the bottom of said open bottom housing;

whereby, light emitted by said light emitting semiconductive device is reflected throughout said open-bottom housing and impinges upon said photo detector semiconductive device.

* * * * *

UNITED STATES PATENT AND TRADEMARK OFFICE
CERTIFICATE OF CORRECTION

PATENT NO. : 4,112,308

DATED : September 5, 1978

INVENTOR(S) : Wilfred W. Olschewski and Robert M. Stitt

It is certified that error appears in the above-identified patent and that said Letters Patent are hereby corrected as shown below:

Column 5, line 14, delete "second", substitute --first--; and

Column 6, line 38, delete "second", substitute --first--.

Signed and Sealed this

Fifteenth Day of November 198.

[SEAL]

Attest:

GERALD J. MOSSINGHOFF

Attesting Officer     Commissioner of Patents and Trademarks